United States Patent [19]
Barnard

[11] Patent Number: 5,474,621
[45] Date of Patent: Dec. 12, 1995

[54] CURRENT COLLECTION SYSTEM FOR PHOTOVOLTAIC CELLS

[75] Inventor: Timothy J. Barnard, Rochester Hills, Mich.

[73] Assignee: Energy Conversion Devices, Inc., Troy, Mich.

[21] Appl. No.: 308,761

[22] Filed: Sep. 19, 1994

[51] Int. Cl.⁶ ........................ H01L 31/04; H01L 31/0224
[52] U.S. Cl. ............................................. 136/256; 257/459
[58] Field of Search ............................. 136/256; 257/459

[56] References Cited

U.S. PATENT DOCUMENTS

| | | | |
|---|---|---|---|
| 4,260,429 | 4/1981 | Moyer | 136/256 |
| 4,348,546 | 9/1982 | Little | 136/256 |
| 4,612,410 | 9/1986 | Hewig et al. | 136/256 |
| 4,614,835 | 9/1986 | Carson et al. | 136/250 |
| 5,084,107 | 1/1992 | Deguchi et al. | 136/256 |
| 5,158,618 | 10/1992 | Rubin et al. | 136/244 |

FOREIGN PATENT DOCUMENTS

| | | | |
|---|---|---|---|
| 59-115524 | 7/1984 | Japan | 136/256 |
| 59-115576 | 7/1984 | Japan | 136/256 |
| 6-204529 | 7/1994 | Japan | 136/256 |

*Primary Examiner*—Aaron Weisstuch
*Attorney, Agent, or Firm*—David W. Schumaker; Marvin S. Siskind; Marc J. Luddy

[57] ABSTRACT

A current collection system for photovoltaic cells. The collection system includes at least one conductive wire; and a plurality of conductive fibers or filaments in contact with the conductive wire and in contact with the photovoltaic cell. The fibers or filaments collect current generated by the photovoltaic cell and conduct the current to the conductive wire, which wire in turn collects current form all of the plurality of fibers or filaments and conducts the current to the major bus bars and terminals.the major bus bars and terminals.

21 Claims, 1 Drawing Sheet

CURRENT COLLECTION SYSTEM FOR PHOTOVOLTAIC CELLS

FIELD OF THE INVENTION

The present invention relates to current collection systems for photovoltaic cells and more particularly to a conductive wire and conductive fiber or filament system in which the fibers or filaments are in electrical contact with both the photovoltaic cell and the conductive wire. The filaments collect current from the photovoltaic cell and transmit it to the conductive wires which, in turn, transmit the current to the external load.

BACKGROUND OF THE INVENTION

To insure that current is collected efficiently from amorphous silicon photovoltaic cells it is necessary to have at least three things: 1) a good current collection grid system distributed over the top conducting oxide (TCO) of the cell; 2) a good conductive link between the top conducting oxide (TCO) and the current collection grid; and 3) a means of carrying the collected current off the active area of the cell to the major bus bars and terminals.

The current collection grids used in existing manufacturing and pilot plants are fabricated by silk screening a silver paste conductive polymer compound onto the top conducting oxide. These pastes are formulated with very fine conductive powders to allow them to flow through the silk screens without clogging. However, the pastes are expensive, and shading from the unavoidably wide grids contributes to a significant portion of the total current collection power losses. In addition to the silver paste grid, a carbon paste grid is screened underneath the silver grid to act as a buffer against shorting. This shorting could occur if the silver paste were to be printed directly over a defective area that exposes a small area of the stainless steel substrate. This is an unfortunate result of the fact that the pastes contain particles small enough to seep into these pinhole defects. With carbon paste underneath the silver paste grid however, the carbon paste would coat any such defective area instead of the silver paste. Because the carbon paste has a much higher resistivity than the silver paste it lessens the effect of any inadvertent electrical connection to the stainless steel substrate through the defect.

Unfortunately, this carbon paste screening step adds to the cost and complexity of the photovoltaic module manufacturing process. It also creates the problem of achieving proper registration between the carbon and silver grid screening. To lessen the required registration precision, the carbon paste grid pattern is made somewhat larger than that of the silver pattern, but this increases shading and hence, power losses.

Another problem with the silver paste grids is that since the electrical conductivity of the grids is not nearly as high as desirable, wire bus bars need to be run across the surface of the module to connect up to the grids and carry their current away with an acceptably low electrical power loss. Present module assembly technology involves connecting the grids to the wire bus bars with dots of silver paste, further adding to the cost and complexity of their manufacture. Also, the relatively thick (26 gauge) wire bus bar, and especially the silver paste dots protrude substantially in height above the surface of the cell causing them to come undesirably close to the front surface of the lamination material in which the photovoltaic module is encapsulated. This in turn can cause them to fail critical tests such as high voltage, scratch and thermo-cycling tests, indicating that their electrical isolation is compromised.

Alternatives to conductive paste grids include evaporated or plated metal coatings enhanced with a solder coating. Although the conductivity of such grids is good, evaporating or plating fine lines of metal is difficult and costly.

The present invention uses thin (34–44, preferably 38–42 gauge) solid copper wires and conductive fibers or filaments, such as carbon fibers, as a combined current collection grid/bus bar system wherein the wires serve the dual purpose of collecting the current from the top conducting oxide as well as carrying it away from the active area of the cell. The advantages of using such wire grids in place of the silk screened silver and carbon paste grids, are 1) potential for reduced manufacturing and module costs, 2) reduced electrical power loss, 3) reduced power loss due to shading, and 4) increased reliability and defect resistance.

Known wire gridding techniques presently rely on standard conductive paste compounds in order to make a physical bond, as well as an electrically conductive link, between the wire grid and the top conductor. These conductive pastes, which are generally opaque or nearly opaque, must be applied carefully so that they do not spread excessively on the top conducting oxide and thereby increase shading, which contributes to power loss. Also, it is important that the adhesion of the conductive paste, which becomes hard upon curing, be maintained throughout the life of the module since it is necessary for good electrical contact.

Advantages over traditional wire grid current collecting systems include:

1. Short and Shunt Resistance

No flowing conductive paste contacts the photovoltaic cell. This eliminates the possibility of a conductive paste creeping into a pin hole and causing a short or a shunt. The likelihood of a fiber going into a pinhole is extremely small as the portions of the fibers which touch the cell lay flat along the surface, therefore laying across pinhole defects instead of going down into the defect.

2. Robustness

Conductive pastes that adhere to the surface of the PV cell could lose their adhesion to this surface. This is especially true whenever there are stresses on the wires such as may occur from changes in temperature or changes in lamination materials over time. Even the smallest amount of this separation will cause a catastrophic loss of conductivity at any point where the separation occurs, resulting in reduced power. Due to the length and flexibility of the fibers of the present invention, the conductive links between the wires and the TCO should be able to endure a reasonably large range of stress imparted on the wires and any consequent movement of the wires without undue conductivity loss. Even if some of these conductive links were to be compromised, the remaining functioning conductive links will continue to collect current. They should even be able to conduct some additional current left uncollected by the compromised fibers, without significant power loss.

3. Simplified Manufacturing and Reduced Manufacturing Costs

The preferred embodiment can substantially simplify manufacturing of the current collection grid by combining the gridding and encapsulation processes. The encapsulation processes is not substantially different from or more complicated than standard processes. The process of manufacturing the specially treated wires can be highly automated, relatively inexpensive, and done independently of any other steps in the manufacture of the PV modules.

SUMMARY OF THE INVENTION

The present invention is a current collection system for single crystalline, polycrystalline, amorphous silicon, or any other type of photovoltaic cells. The collection system includes at least one conductive wire; and a plurality of conductive fibers or filaments in contact with the conductive wire and in contact with the top conductive oxide of the photovoltaic cell. The fibers or filaments collect current generated by the photovoltaic cell and conduct the current to the conductive wire, which wire in turn collects current form all of the plurality of fibers or filaments and conducts the current to an external load.

The current collection system may further include a matrix of non-conductive, transparent, protective matrix material encapsulating the conductive wire and the conductive fibers or filaments. Preferably the matrix is formed from EVA; a thermosetting material; a thermoplastic material, such as polyester or polyethylene; or a hardcoat material, such as acrylics, silicones, UV curable adhesives, or epoxy resins.

Preferably the conductive wire is formed from a conductive metal, such as a copper wire. Preferably the conductive fibers or filaments are formed from a conductive material, such as a conductive carbon material or a conductive graphite material.

The conductive fibers or filaments can be short, being on the order of about 30 microns in length to about 1 millimeter in length.

The conductive fibers or filaments may also be long, being greater than about 0.5 centimeters to several centimeters in length. Preferably the long conductive fibers or filaments are wrapped or woven around the wire.

In a preferred embodiment, the fibers or filaments are bonded to the wire with a cured conductive paste and are in ohmic contact with the top conductive oxide. The conductive paste may be a paste of carbon; nickel; copper; or even a conductive oxide, such as indium tin oxide.

DETAILED DESCRIPTION OF THE INVENTION

Figure 1:
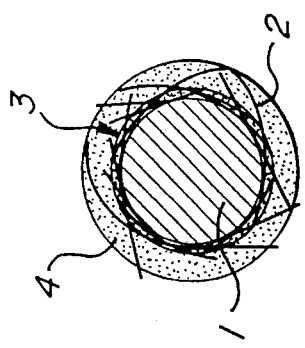
FIG. 1 is a schematic depiction of a cross-sectional view, not to scale, of a first embodiment of the photovoltaic cell current collection system of the present invention, specifically showing the conductive wire and conductive fibers or filaments.
Figure 4:
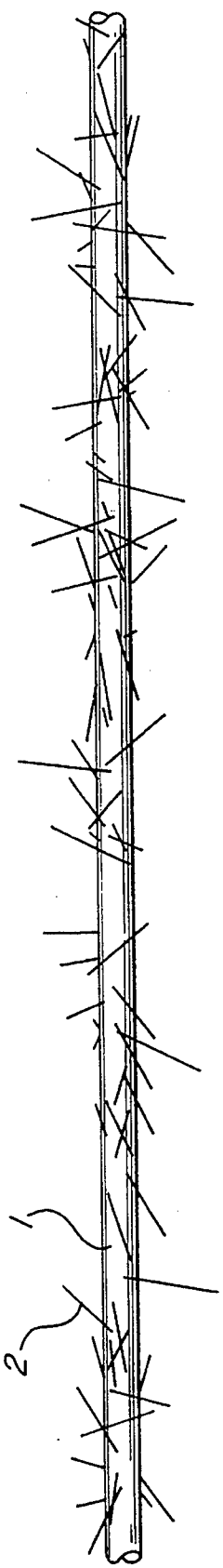
FIG. 4 is a side long view, not to scale, of the first embodiment of the photovoltaic cell current collection system of the present invention depicted in FIG. 1, specifically showing the conductive wire and conductive fibers or filaments.

Turning now to FIGS. 1 and 4, there is depicted therein one embodiment of a photovoltaic cell current collector of the present invention. Specifically, the current collector comprises a conductive wire 1 which is in electrical contact with conductive fibers or filaments 2. The conductive wire 1 can be formed from any highly conductive material and is preferably a conductive metal material, such as a conductive copper wire. The conductive wires 1 are preferably thin (34–44, preferably 38–42 gauge) solid copper wires which act as a combined current collection grid/bus bar system, wherein the wires serve the dual purpose of collecting the current from the top conducting oxide via the conductive fibers as well as carrying it away from the active area of the photovoltaic cell. The conductive wires I preferably run the length of the active area of the photovoltaic cell. The wires can be bare (non-plated) or may be plated with a conductive coating such as nickel, tin, or silver.

The conductive fibers or filaments 2 can be formed from any conductive material, but are preferably carbon or graphite fibers. The fibers may also be formed from: metals such as nickel, copper, or stainless steel; metal coated fibers such as metal coated graphite, metal coated carbon, or metal coated glass fibers; or conductive oxide (such as indium tin oxide) coated glass or carbon fibers. The fibers or filaments 2 are typically much thinner that the conductive wire 1 and are preferably about 6 to 8 microns in diameter, but this may vary widely. The conductive fibers or filaments 2 may be short fibers of about 30 microns to 1 millimeter in length or long fibers of about 0.5 to 30 centimeters or more in length.

Short fibers may be positioned under the conductive wire 1, such that they lie between the wire and the top conductor of the photovoltaic cell, or they may in turn be draped over the wire or contact the wire on its sides. Preferably the short fibers are randomly, but relatively evenly, distributed around the circumference of the wire, all along its length. Long fibers may be wrapped around the conductive wire 1 or they may be woven or interleaved around the wire.

The conductive fibers or filaments 2 are in ohmic contact with both the top conductor of the photovoltaic cell and the conductive wire 1. Current from the photovoltaic cell is collected by the conductive fibers or filaments 2 and transmitted to the conductive wire 1, which, in turn, collects the current from the fibers or filaments 2 and transmits it to the major bus bars and terminals.

Figure 2:
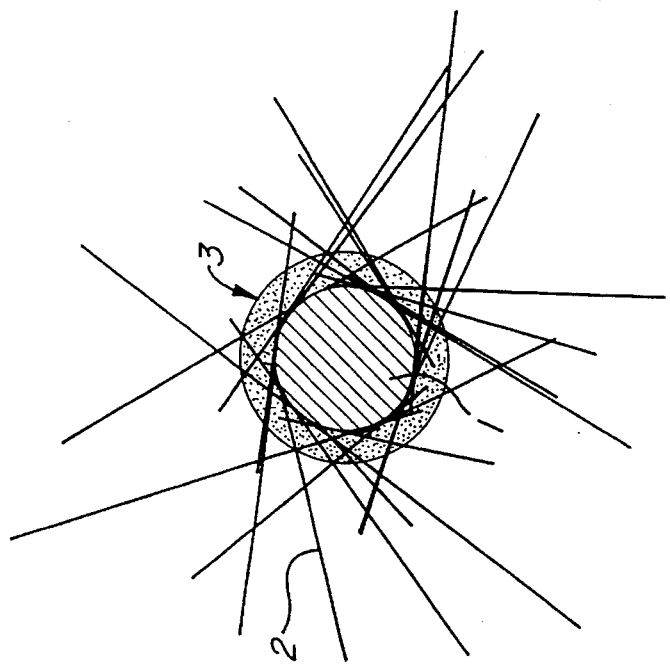
FIG. 2 is a schematic depiction of a cross-sectional view, not to scale, of a second embodiment of the photovoltaic cell current collection system of the present invention, specifically showing the conductive wire, conductive fibers or filaments, and the conductive paste which binds the fibers to the wire.

To assist in making physical and electrical connections between the conductive fibers or filaments 2 and the conductive wire 1, the conductive wire may be coated with a conductive paste 3 as shown in FIG. 2. While the conductive paste is preferably a carbon paste, it can be a paste of other conductive materials such as nickel, silver, copper, or a conductive oxide such as indium tin oxide. The paste binder is preferably an epoxy type paste with a catalyst so that adhesion will be very good.

To produce the fiber coated ("fuzzy") wire, the fibers should be adhered to the conductive paste while still "wet" and thereafter the paste should be dried or cured. The fuzzy wire can then be stored for later application to photovoltaic cells or can be used directly after manufacture thereof.

Figure 3:
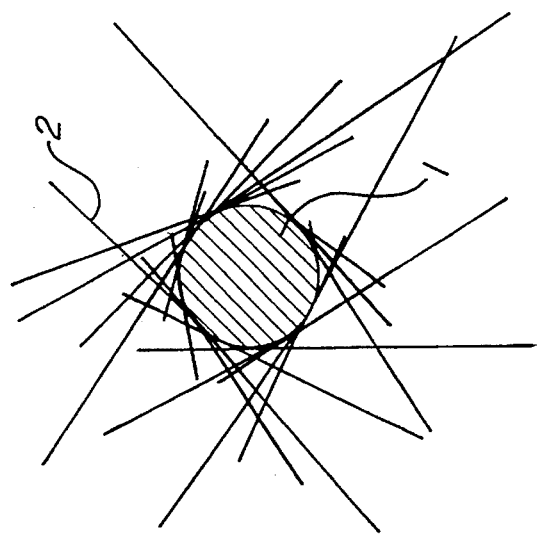
FIG. 3 is a schematic depiction of a cross-sectional view, not to scale, of a third embodiment of the photovoltaic cell current collection system of the present invention, specifically showing the conductive wire, conductive fibers or filaments, the conductive paste which binds the fibers to the wire, and the non-conductive matrix material which encapsulates the wire, fibers, and conductive paste.

A matrix material 4, as shown in FIG. 3, may be used to encapsulate the fibers and wire (and the conductive paste if present). The matrix material 4 is preferably substantially transparent to visible light. The matrix material is preferably ethylene vinyl acetate (EVA) based because this is the material that is conventionally used to laminate photovoltaic cells with. However, the matrix material may also be a thermosetting polymer; a thermoplastic material such as polyester or polyethylene; or a hard coat material such as acrylics, silicones, or UV curable adhesives or epoxy resins.

While there are many possible methods for producing wire/fiber/matrix systems, a few methods contemplated by the present inventors will now be discussed. In a first method, in which short fibers are positioned over the top of the conductive wire, the wire is first coated with the matrix material. The coated wire then can be placed on top of the photovoltaic cell and the fibers can be dispersed on top of the wire. In a second method, in which short fibers are positioned between the conductive wire and the photovoltaic cell, the wire is first coated with the matrix material. The fibers are dispersed on the photovoltaic cell and then the coated wire is placed on top of the photovoltaic cell and the fibers. A third embodiment combines the first and second. In the third method, in which short fibers are positioned over the top of the conductive wire and between the conductive wire and the photovoltaic cell, the wire is first coated with the matrix material. The fibers are dispersed on the photovoltaic cell, the coated wire is placed on top of the photovoltaic cell and the fibers and then more fibers are dispersed on top of the wire.

Alternative to these methods, the fibers can be attached to the conductive wire before the wire is attached to the photovoltaic cell. The fibers may be electrostatically attached to a matrix coated wire and used as such or the matrix may be remelted to lock the fibers in place. On the other hand, the fibers may also be dispersed onto the matrix coated wire while the matrix material is still molten and then the coating can be allowed to harden to lock the fibers in place. Still another method, involves mixing the fibers with the molten matrix material before it is used to coat the wires and then coating the wires with the fiber/matrix mixture.

To insure that there is sufficient ohmic contact between the fibers and the wire and between the fibers and the TCO, a vacuum lamination process is performed. This particular lamination process is independent from, and precedes the final vacuum lamination which is performed in order to encapsulate the cell or module. This contact-forming lamination also maintains a permanent hold between the fibers and the wire and between the fibers and the TCO so that the ohmic contacts persist after the lamination step and lasts for the life of the module.

To apply long fibers to the conductive wires, the wires can first be coated with the matrix material and then the long fibers can be wrapped or woven around the coated wire. Alternatively, the fibers can first be wrapped or woven around the wire and then the matrix material can be coated over the fibers and wire.

This vacuum lamination process is sometimes known as vacuum bagging and is well known in the art, in particular, in the fiberglass industry. The process comprises placing the photovoltaic assembly with the fibers, wire, and matrix material in place, into a sealed compartment which is to be evacuated of all or nearly all the air contained within. When evacuated, atmospheric pressure from outside the sealed compartment is applied to the PV assembly by means of a flexible diaphragm which makes up the side of the sealed compartment adjacent the wires and fibers. Once sufficiently evacuated, heat may be applied to the PV assembly in order to cause the matrix material to flow and allow the fibers to press against the wires and the TCO. In the case where the matrix material is a thermoplastic, upon cooling it will be set. It is important to choose a thermoplastic which softens at a high enough temperature so that when the final encapsulation is done, the matrix material does not re-flow and cause the contacts between the fibers and the wire and the TCO to loosen. In the case where the matrix material is thermal setting, the heat also sets the matrix material. In the case where the matrix material is UV curable, heating is not necessary. In this case, because the UV curable adhesive is a liquid at room temperature, the diaphragm will be pressing the fibers against the wires and the TCO immediately upon evacuation of the compartment. When using a UV curable adhesive as a matrix the diaphragm should be substantially transparent to UV light. Once the compartment is sufficiently evacuated, the matrix is exposed to UV light transmitted through the diaphragm, effecting a cure.

It is important that the amount of matrix material be controlled. If the matrix material is too thick, the fibers will not make good contact with the wire, because the fibers will "float" in the matrix material when it is wet or molten, during subsequent lamination to the photovoltaic cell. If the matrix material is too thin, the fibers will not be securely held in place. For these reasons, it is preferable that the thickness of the matrix material layer be on the order of the thickness of the fibers or somewhat less. This allows the fibers to make adequate contact with the wire and still be held securely in place.

To produce a wire/paste/fiber/matrix system, similar methods can be used, with the main difference being that the wire is first coated with a conductive paste, to which the fibers can be adhered to while the paste is still in its adhesive state and then the paste can be dried or cured. The wire can then be coated with a matrix material.

Some exemplary methods for attaching the current-collecting, fiber-coated wires to a photovoltaic cell will now be discussed. A heated vacuum lamination process is typically used to remelt the matrix material and adhere the fiber coated wires to the cell. If the coated wire does not have a matrix material, or if additional matrix material is required, matrix material can be applied to the photovoltaic cell before the wires are placed thereon and before the lamination step. Again, matrix thickness is important for the reasons stated above. The matrix material can be applied to the photovoltaic cell as a continuous coating or can be applied in strips only to the areas in which wires are to be adhered. Alternatively, the additional matrix material may be applied in small dots or sprayed on as small droplets to secure the wires at spaced intervals along its length.

In a preferred embodiment, where the fibers are first adhered to the wire with a conductive paste which is subsequently cured, the vacuum lamination process can be made simpler than the processes used with the other embodiments. For one thing, it is not necessary to press the fibers against the wire since they are already in ohmic contact due to the cured conductive paste covering the wire. Nor is it necessary to bind the fibers to the wire because they are already bound by the cured paste. Only enough pressure applied along the length of the wire is necessary so that the wire comes in close contact with the TCO. The distance between the bottom of the wire and the TCO surface should be anywhere from negligible, or in direct contact, to just within the typical length of the fibers. Once the wires are close enough to the TCO surface a sufficient number of fibers will touch the TCO. Due to the springiness of the fibers, they will bend somewhat when they touch and thereby maintain a light pressure against the TCO surface and maintain an ohmic contact. It may also be necessary to include a substantially transparent spacer material between the wires and the vacuum diaphragm in order to insure that the wires are pushed close to the TCO surface by the diaphragm. Otherwise, particularly if there is much matrix material, the wires could end up simply floating in the matrix material with equal pressure all around them.

A separate vacuum lamination process can be used to affix the conductive paste/fiber coated wires just as for the other embodiments discussed above. However, the preferred method is to combine the affixing step with the final encapsulation. In this case the matrix material would be the encapsulation material, usually EVA.

Another consideration when applying the fiber coated wires to photovoltaic cells is the requirement of holding the wires flush or close to the cell during the subsequent standard EVA protection layer lamination of the entire cell. One method for holding the wires flush is to apply tension to the ends of the wires during lamination. This is enhanced by causing the photovoltaic cell to assume a slightly convex shape during tensioning/lamination.

Another, more preferable method of holding the wires flush with the photovoltaic cell during heated vacuum lamination, particularly those with fibers already attached, is to use one or more layers of Craneglass (Trademark of Crane & Co., Inc., Dalton, Mass.) or Fiberglass mat or cloth above the wires to act as a shim which presses the wires against the cell. This method can have many variations, just a few of which are mentioned hereinafter. In a first method, a thin layer of Craneglass or Fiberglass mat or cloth is applied to the photovoltaic cell. Next, the fiber coated conductive wires are placed onto the thin layer of Craneglass or Fiberglass. The thin layer is thin enough and porous enough that very many of the fibers attached to the conductive wire pass therethrough and contact the photovoltaic cell. Thereafter, a thick layer of Craneglass or Fiberglass mat or cloth, which acts as a shim during lamination, is applied over the wires and the thin layer.

In a more preferred embodiment, the wires may be attached to the layer of Craneglass or Fiberglass mat or cloth before the layer is applied to the photovoltaic cell. This allows a preform of the glass and wires to be made in advance and used as desired, particularly in a continuous type process. That is, a large roll of thin Craneglass may have the desired number of conductive wires attached thereto in the required configuration, spacing etc. The Craneglass may then be rerolled or stacked in cut sheets and used at a future time. When the thin glass/wire composite is used, it is placed wire side up on the photovoltaic cell and covered, as above, with a thick layer of Craneglass or Fiberglass mat or cloth to act as a shim during heated vacuum lamination. The thin under layer of Craneglass or Fiberglass acts as a bottom spacer for the conductive wire/fiber composite. The spacer helps to insure that the fibers are not crushed and broken during the lamination step, thus preventing loss of current collection pathways. This is not always necessary, as some fibers are particularly flexible and/or malleable. Therefore, this thin layer may be eliminated in some instances and the wire/fiber composite may be attached to the underside of the shim layer of Craneglass or Fiberglass, in which case, the wire/fiber composite would be in direct contact with the photovoltaic cell. Once the wires, spacers and shims are in place, the cell is laminated by a conventional process.

While Craneglass or Fiberglass are disclosed as the spacers and shims, other material can be used as long as it is transparent to light.

Examples of the present invention and comparative examples are given in Table 1. For these examples, active photovoltaic material was etched into narrow strips of about 3–4 millimeters in width by about 6.5 centimeters in length. To insure accurate results, only strips that had greater than about 1.7 volts under room-light illumination were used in the tests. One wire was applied to each strip. The comparative examples received wires that were coated only with carbon paste. These comparative wires were applied while the paste was still wet and cured in place. The other strips received fiber coated wires. All strips were laminated with EVA using 4 or 5 thin layers of 5 mil thick Craneglass 203 as the shim layer, thereby pressing the wires down against the surface of the photovoltaic cells.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

TABLE 1

| Sample Number | Wire Type | # Sheets Craneglass | Fill Factor | Sample Resistance |
|---|---|---|---|---|
| 1 | Many fibers | 4 | .695 | 18.2 |
| 2 | Carbon paste | 4 | .693 | 19.5 |
| 3 | Med. # fibers | 4 | .694 | 17.4 |
| 4 | Carbon paste | 4 | .690 | 17.7 |
| 5 | Med.–few # fib. | 4 | .691 | 17.3 |
| 6 | Carbon paste | 4 | .672 | 21.4 |
| 7 | Few fibers | 4 | .678 | 23.9 |
| 8 | Carbon paste | 5 | .694 | 20.6 |
| 9 | Med. # fibers | 5 | .699 | 19.5 |

I claim:

1. A photovoltaic cell including a current collection system, said collection system including:

at least one conductive wire; and a plurality of conductive fibers or filaments in contact with said conductive wire and in contact with the photovoltaic cell; said fibers or filaments collecting current generated by said photovoltaic cell and conducting said current to said conductive wire, which wire in turn collects current form all of said plurality of fibers or filaments and conducts said current to the major bus bars and terminals of said cell.

2. The cell of claim 1, further including a matrix of nonconductive, transparent, protective material encapsulating said conductive wire and said conductive fibers or filaments.

3. The cell of claim 2, wherein said matrix is formed from EVA.

4. The cell of claim 2, wherein said matrix is formed from a thermosetting material.

5. The cell of claim 2, wherein said matrix is formed from a thermoplastic material.

6. The cell of claim 5, wherein said thermoplastic is selected from polyester and polyethylene.

7. The cell of claim 2, wherein said matrix is formed from a hardcoat material selected from acrylics, silicones, and UV curable epoxy resins.

8. The cell of claim 1, wherein said conductive wire is formed from a conductive metal.

9. The cell of claim 8, wherein said conductive wire is a copper wire.

10. The cell of claim 1, wherein said conductive fibers or filaments are formed from a conductive non-metal material.

11. The cell of claim 10, wherein said conductive fibers or filaments are formed from a conductive carbon material.

12. The cell of claim 11, wherein said conductive fibers or filaments are formed from a conductive graphite material.

13. The cell of claim 1, wherein said conductive fibers or filaments are between about 30 microns to about 1 millimeter in length.

14. The cell of claim 13, wherein said conductive fibers or filaments contact said conductive wire at points adjacent said photovoltaic cell.

15. The cell of claim 13, wherein said conductive fibers or filaments contact said conductive wire at points which are remote from said photovoltaic cell.

16. The cell of claim 1, wherein said conductive fibers or filaments are greater than about 0.5 centimeters to several centimeters in length.

17. The cell of claim 16, wherein said conductive fibers or filaments are wrapped or woven around said wire.

18. The cell of claim 1, wherein said fibers or filaments are bonded to said wire with a conductive paste.

19. The cell of claim 18, wherein said conductive paste is selected from the group consisting of pastes of carbon, nickel, copper, and conductive oxides.

20. The cell of claim 19, wherein said conductive oxide is indium tin oxide.

21. The cell of claim 1, wherein a layer of substantially transparent spacer is placed above said wire and fibers to press said fibers and wire into mechanical and electrical contact with said Photovoltaic cell.

* * * * *